United States Patent
Swapp

Patent Number: 5,617,035
Date of Patent: Apr. 1, 1997

[54] METHOD FOR TESTING INTEGRATED DEVICES

[75] Inventor: Mavin C. Swapp, Gilbert, Ariz.

[73] Assignee: Motorola, Inc., Schaumburg, Ill.

[21] Appl. No.: 552,518

[22] Filed: Nov. 2, 1995

Related U.S. Application Data

[62] Division of Ser. No. 143,949, Nov. 1, 1993, Pat. No. 5,467,024.

[51] Int. Cl.⁶ .............................. G01R 1/04; G01R 31/28
[52] U.S. Cl. .......................................... 324/711; 324/115
[58] Field of Search .................................... 324/711, 731; 323/4; 371/20

[56] References Cited

U.S. PATENT DOCUMENTS

| | | | |
|---|---|---|---|
| 4,177,417 | 12/1979 | Henry et al. | 323/4 |
| 4,637,020 | 1/1987 | Schinabeck | 371/20 |
| 4,646,299 | 2/1987 | Schinabeck et al. | 371/37.1 |
| 5,101,153 | 3/1992 | Morong, III | 324/73.1 |
| 5,319,305 | 6/1994 | Baba | 324/115 |

OTHER PUBLICATIONS

Brooktree Corporation Product Bulletin, Bt648—Octal Pin Electronics Driver/Receiver, Feb. 1993, pp. 1–2.
Brooktree Corporation Product Advance Information document, Bt648—Octal Pin Electronics Driver/Receiver, Jan. 4, 1993, pp. 1–13.

Primary Examiner—Kenneth A. Wieder
Assistant Examiner—Barry C. Bowser
Attorney, Agent, or Firm—Rennie William Dover

[57] ABSTRACT

An integrated device test system (10, 40) having AC and DC measurement modes of operation comprises a drive circuit (11, 41), a programmable measurement unit (12) and a switch (18). The drive circuit (11, 41) may be a current mode drive circuit (11) or a voltage mode drive circuit (41). The drive circuit (11, 41) is coupled to the programmable measurement unit (12) and a device under test (64). In a DC mode of operation, the switch (18) is configured to couple a sense terminal (39) with one end of an isolation resistor (66). A second end of the isolation resistor (66) is connected to a pin (63) of the device under test (64). In an AC mode of operation, the switch (18) is configured to couple the sense terminal (39) with the drive circuit (11, 41) and the force terminal (35) of the programmable measurement unit (12).

13 Claims, 3 Drawing Sheets

5,617,035

METHOD FOR TESTING INTEGRATED DEVICES

This is a division of application Ser. No. 08/143,949, filed Nov. 1, 1993, now U.S. Pat. No. 5,467,024.

FIELD OF THE INVENTION

This invention relates, in general, to test systems, and more particularly, to a method and apparatus for testing integrated devices.

BACKGROUND OF THE INVENTION

Typically, the AC and DC parameters of integrated devices are evaluated or tested prior to releasing them as finished product. One approach to testing these parameters is to provide an AC test system to test the AC parameters and a DC test system to test the DC parameters. Another approach is to incorporate a mechanical relay into a test system to permit the use of a single test system to test both the AC and the DC parameters. More particularly, the DC parameters are tested when the relay is in one configuration and the AC parameters are tested when the relay is in a different configuration. Generally, the relay introduces a parasitic capacitance which degrades the AC tests. Further, the time required to switch the relay from one configuration to a second configuration limits the number of devices that are tested per unit time.

Accordingly, it would be advantageous to have a test system capable of performing both AC and DC measurements, wherein the measurement of both the AC and DC parameters is extremely accurate, i.e., the parasitic capacitance introduced by the relay is minimized. It would be of further advantage for the test system to be capable of testing a large number of devices per unit time.

SUMMARY OF THE INVENTION

An integrated device test system having AC and DC measurement modes of operation comprises a drive circuit having first and second ports, and a programmable supply that supplies one of a voltage or a current to the first port, wherein one of a voltage measurement or a current measurement is made via the second port during the AC and DC measurement modes of operation.

In another aspect, the present invention includes a method of delivering an electrical signal to an integrated device. The method comprises delivering an AC electrical signal to the integrated device, wherein the step of delivering the AC electrical signal comprises the steps of applying a first voltage to a drive circuit, developing a second voltage across a first portion of the drive circuit, and transmitting a third voltage to the integrated device. The method further comprises delivering a DC electrical signal to the integrated device, wherein the step of delivering the DC electrical signal comprises the steps of applying a fourth voltage to the drive circuit, and transmitting the fourth voltage to the integrated device, the fourth voltage being transmitted through the first portion of the drive circuit.

DETAILED DESCRIPTION OF THE DRAWINGS

The present invention provides a method and apparatus for measuring the AC and DC parameters of an integrated device using a single test system without compromising the accuracy of either the AC or DC measurements. This is accomplished by performing voltage and current measurements via an AC drive circuit during AC and DC measurement modes of operation. In other words, the DC parameters are measured through an AC drive path. During the DC measurement mode of operation, a sense line of a programmable measurement unit (PMU) is connected to a pin of a device under test (DUT) to provide an accurate measurement of a force voltage level at that pin. During the AC measurement mode of operation, the PMU serves as a voltage supply. Further, the sense line of the PMU is connected to the AC drive circuit to ensure that the supplied voltage is accurate.

Figure 1:
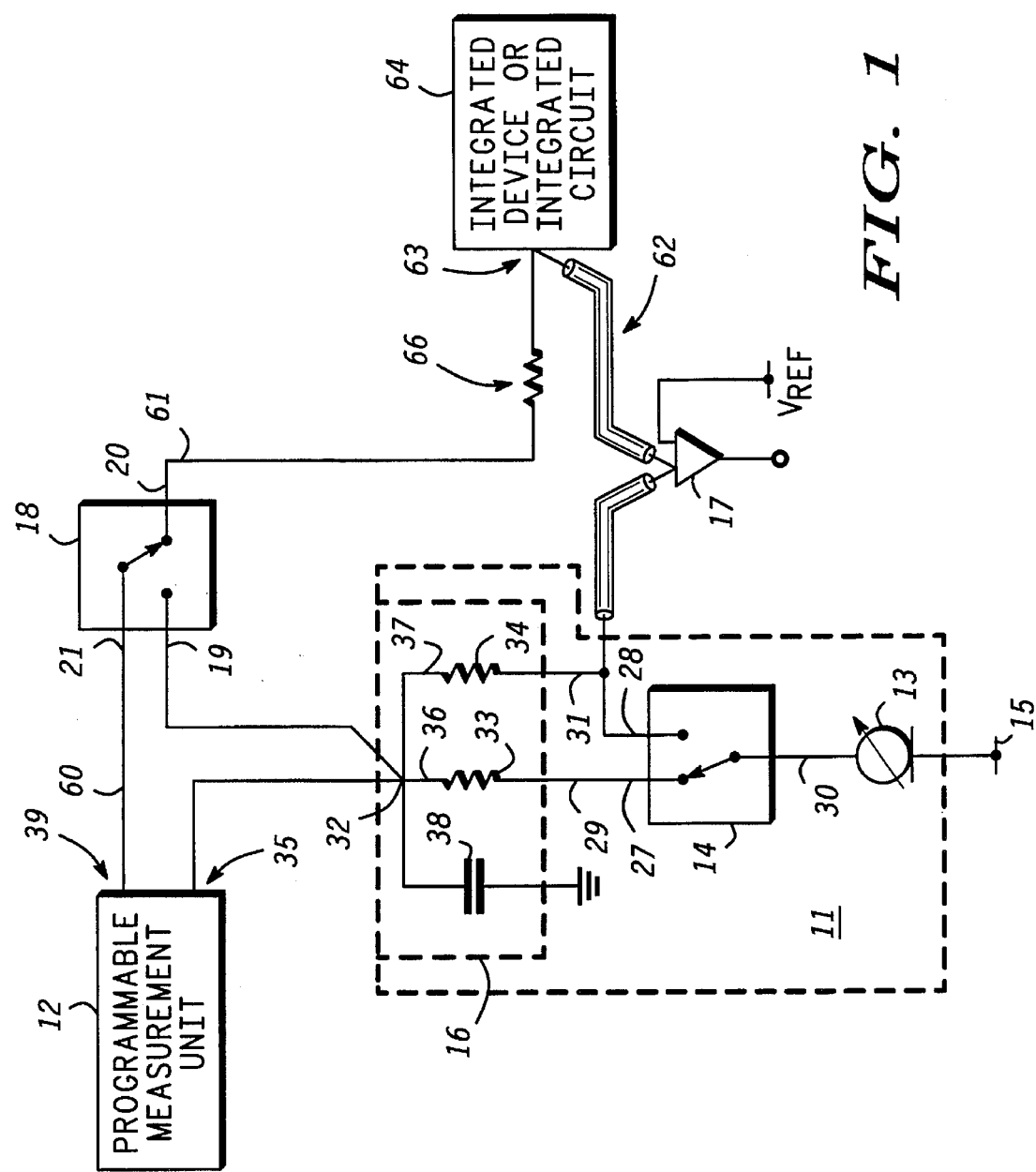
FIG. 1 illustrates a schematic diagram of an integrated device test system in accordance with a first embodiment of the present invention.

FIG. 1 illustrates schematic diagram of a test system 10 in accordance with an embodiment of the present invention. The test system 10 is also referred to as an integrated device test system. The test system 10 comprises a drive circuit 11, a programmable measurement unit 12, and an analog multiplexer 18. The drive circuit 11 (also referred to as an AC driver) is a current mode drive circuit which provides two AC drive levels at a switch terminal 28 of a switch 14. In other words, the drive circuit 11 provides a high drive level (i.e., a logic high voltage level) or a low drive level (i.e., a logic low voltage level) at the switch terminal 28. When the device under test 64 is an emitter coupled logic (ECL) circuit, the high drive level is approximately 1.05 volts and the low drive level is approximately 0.3 volts. The device under test 64 is typically an integrated device such as an integrated circuit.

The drive circuit 11 comprises a programmable current source 13, the switch 14, and a load network 16. The programmable current source 13 has one terminal connected to a node 15 and a terminal connected to the switch 14 via a switch terminal 30. By way of example, the switch 14 is a solid state switch. Further, the node 15 is at a desired voltage level and may be coupled to, for example, a voltage supply terminal (not shown). Programmable current sources such as programmable current source 13 are well known to those skilled in the art. A description of a current source capable of use as a programmable current source may be found in U.S. Pat. No. 4,177,417, entitled "Reference Circuit for Providing a Plurality of Regulated Currents Having Desired Temperature Characteristics."

The load network 16 has a load network terminal 29, a load network terminal 31, and a load network terminal 32, wherein the load network terminal 32 serves as a port. More particularly, the load network 16 comprises a resistor 33, a resistor 34, and a capacitor 38. It is preferable that the resistors 33 and 34 be of equal value; however this is not a limitation of the present invention, thus the values of the resistors 33 and 34 may be different. The resistor 33 has a terminal 36, and a terminal 29 which serves as the load network terminal. The resistor 34 has a terminal 37, and a terminal 31 which serves as the load network terminal. The capacitor 38 has one terminal connected to the terminal 36 and one terminal connected to a voltage potential. Preferably, the voltage potential is a ground potential. The capacitor 38 serves as a bypass capacitor. The terminal 36, the terminal 37 and one terminal of the capacitor 38 are electrically coupled to form the load network terminal 32.

Figure 2:
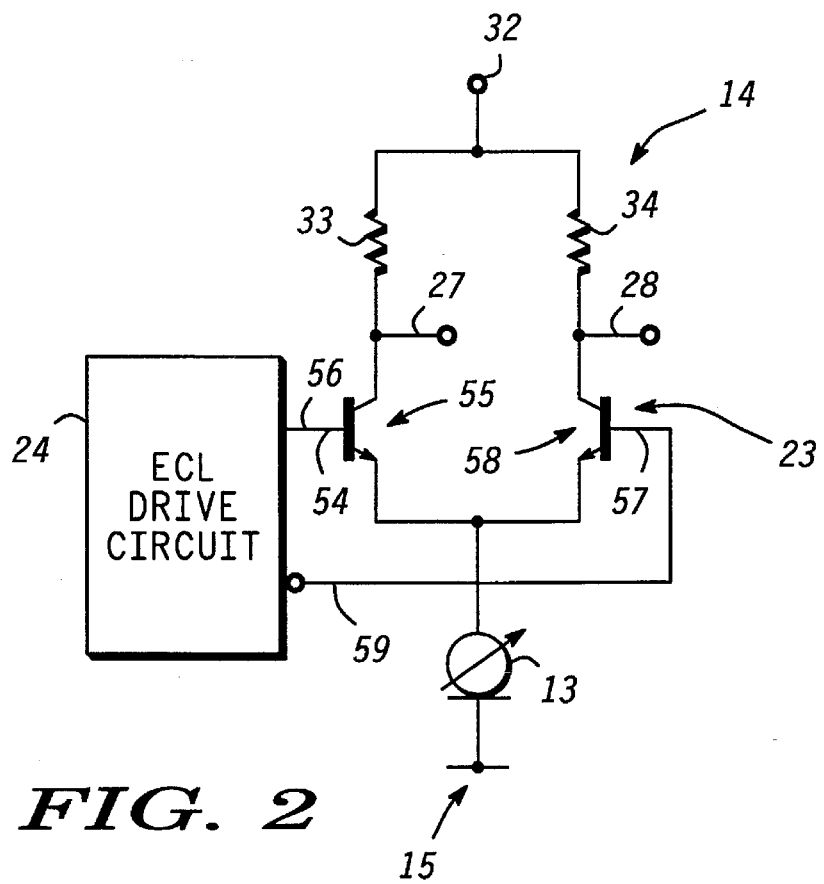
FIG. 2 illustrates a schematic diagram of a switch used in the integrated device test system of FIG. 1.

The switch 14 has a switch terminal 27, the switch terminal 28, and the switch terminal 30. One embodiment of the switch 14 is illustrated in FIG. 2, wherein the switch 14 comprises a differential pair 23 formed from two high speed NPN transistors. A base terminal 54 of the NPN transistor 55 is connected to an output terminal 56 of an ECL drive circuit 24, and a base terminal 57 of the NPN transistor 58 is connected to a complementary output terminal 59 of the ECL drive circuit 24, wherein the ECL drive circuit is part of a test system (not shown). ECL drive circuits such as ECL drive circuit 24 are well known and commonly used in test systems. The emitter terminals of the differential pair 23 are connected to the programmable current source 13. The collector terminal of the NPN transistor 55 serves as the switch terminal 27 and the collector terminal of the NPN transistor 58 serves as the switch terminal 28. By way of example, the switch 14 is capable of switching at a frequency of at least 400 MHz. Further, the rise and fall times of the voltages transmitted from the switch terminal 28 are on the order of 100 picoseconds for AC testing. It shall be understood that the same reference numerals are used in the figures to denote the same elements.

The switch terminal 27 is connected to the resistor 33 and the switch terminal 28 is connected to the resistor 34. As those skilled in the art are aware, the ECL drive circuit 24 provides complimentary signals which turn on one NPN transistor 55 of the differential pair while turning off the other NPN transistor 57 of the differential pair 23. Thus, current from the programmable current source 13 is switched through the resistors 33 and 34 of the load network 16, thereby providing complimentary drive signals at the switch terminals 27 and 28. Although the differential pair 23 has been described using NPN transistors, it shall be understood that this is not a limitation of the present invention, and that the differential pair may be a field effect transistor differential pair, a PNP transistor differential pair, or the like.

Referring again to FIG. 1, the PMU 12 has a force terminal 35 and a sense terminal 39. The PMU 12 is also referred to as a programmable supply or a programmable voltage and current source. In other words, a programmable voltage source or a programmable voltage and current source may be used to apply an electrical signal to the drive circuit. In one example, the PMU 12 is a programmable voltage supply having remote sensing Kelvin connections and current measuring capabilities, wherein the PMU 12 forces a voltage and measures a corresponding current. In a first example, the PMU 12 is a programmable current supply that can force a known current and remotely sense a resulting voltage. The force terminal 35 is connected to the load network terminal 32 and the sense terminal is connected to a switch 18 via a sense line 60.

The switch 18 is an analog multiplexer having a lead 19, a lead 21, and a lead 20. Although not shown, it is understood by those skilled in the art that the switch 18 is controlled by control circuitry supplied by a tester (not shown) analogous to that described for the PMU 12 described supra. The lead 19 is connected to the load network terminal 32 of the drive circuit 11. The lead 20 is connected to one end of an isolation resistor 66 via a remote sense line 61. The other end of the isolation resistor 66 is connected to a pin or integrated device lead 63 of a device under test 64. Although only one pin 63 of the device under test is shown as being connected to the integrated device test system 10, it shall be understood that all the pins 63 of the device under test 64 may be tested using the integrated circuit test system 10.

In addition, a voltage detector 17 is provided, wherein one input terminal to the voltage detector is coupled to the switch terminal 28 and to the pin 63 via a force line 62. Another input terminal of the voltage detector 17 is coupled to a reference voltage level labelled $V_{REF}$ in FIG. 1. The reference voltage $V_{REF}$ is selected in accordance with the electrical signal travelling towards the integrated device 64. Preferably force line 62 is a transmission line having a characteristic impedance approximately equal to the resistance value of the resistor 34. For example, when the resistor 34 has a resistance value of approximately 50 ohms, the characteristic impedance of the transmission line 62 is set to match that of the resistance value of the resistor 34, i.e., the characteristic impedance of the transmission line 62 is set to approximately 50 ohms. Thus, the voltage detector cooperates with the transmission line to couple switch terminal 28 to the pin 63 of the integrated device 64.

In operation, the integrated circuit test system 10 is used to measure the AC and DC parameters of an integrated device 64. For DC measurements, the switch 14 is configured such that the switch terminal 30 is electrically connected to the load terminal 29, and the switch 18 is configured such that the sense terminal 39 is electrically connected to the isolation resistor 66, and thus to the pin 63. In FIG. 1, switches 14 and 18 are shown in the configuration used for making DC measurements, i.e., the DC measurement mode of operation. The PMU 12 forces a known current through the load network terminal 32 which appears at the pin 63. In other words, a current (i.e., a DC electrical signal) is applied to the port 32 of the drive circuit 11 and transmitted through the drive circuit 11. The current flows through the second port 28 and travels to the integrated device 64. Thus, the current is transmitted through the load network 16 of the drive circuit 11 and is delivered to the integrated device 64. The DC voltage appearing on the pin 63 is sensed or measured by the sense terminal 39 of the PMU 12. In other words, during the DC measurement mode of operation, the PMU 12 provides an accurate measurement of the voltage level appearing at the pin 63.

It shall be understood that the PMU 12 is not limited to forcing a known current. Alternatively, the PMU 12 delivers a known voltage, which is transmitted through the load network 16 and to the integrated device 64. The current entering the pin 63 of the integrated device 64 is sensed or measured by the sense terminal 39 of the PMU 12.

For AC measurements, the switch 18 is configured such that the sense terminal 39 is electrically connected to the load network terminal 32. Typically, the PMU 12 provides or applies a known voltage at the load network terminal 32. The voltage appearing at the switch terminal 28 is set in accordance with the position of the switch 14, which in turn is set by the drive circuit 24 (shown in FIG. 2). The drive circuit 24 is a portion of a tester (not shown). More particularly, when the switch terminal 30 of the switch 14 is connected to the switch terminal 27, the voltage appearing at the switch terminal 28 is substantially the same as the voltage supplied by the PMU 12. This voltage is typically referred to as the logic high voltage level. The voltage appearing at the port or switch terminal 28 is transmitted or delivered to the integrated device 64.

When the switch terminal 30 is connected to the port or switch terminal 28 of the switch 14, current flows through the resistor 34. The current flowing through the resistor 34 is set by the programmable current source 13. Thus, the programmable current source 13 is programmed to drive a desired current through the resistor 34. The product of the current flowing through the resistor 34 and the resistance value of the resistor 34 is the voltage drop across the resistor 34. Thus, a voltage is developed across the resistor 34, i.e., the voltage is developed between the ports or nodes 32 and 28 of the drive circuit 11, by forcing a current through the resistor 34. The voltage appearing at the port 28 is substantially the difference between the voltage at the load network terminal 32 and the voltage across the resistor 34. This voltage is referred to as a logic low voltage level because it is less than the logic high voltage level by the voltage drop across the resistor 34. Again, the voltage appearing at the port or switch terminal 28 is transmitted or delivered to the integrated device 64.

It shall be understood that the low voltage level transmitted down the transmission line 62 is set by the programmable current source 13. In other words, the amplitude of the current level set by the programmable current source 13 sets the voltage appearing across the resistor 34. The difference between the voltage forced by the PMU 12 and the voltage appearing across the resistor 34 is the voltage appearing at the port 28, and transmitted to the integrated device 64. Thus, for a desired logic low voltage level to appear at the port 28, the current through the resistor 34 is set such that the difference between the voltage appearing at the port 32 and the voltage across the resistor 34 is the desired logic low voltage level.

The voltage appearing at the node or switch terminal 28 flows down the transmission line 62, past the voltage detector 17 and to the pin 63. The voltage detector 17 is used for making AC timing measurements. In other words, the voltage detector 17 is used to time the voltage signals travelling to the pin 63 when the pin 63 is an input pin. The isolation resistor 66 isolates the capacitance of the sense line 61 during the AC measurement mode of operation.

Figure 3:
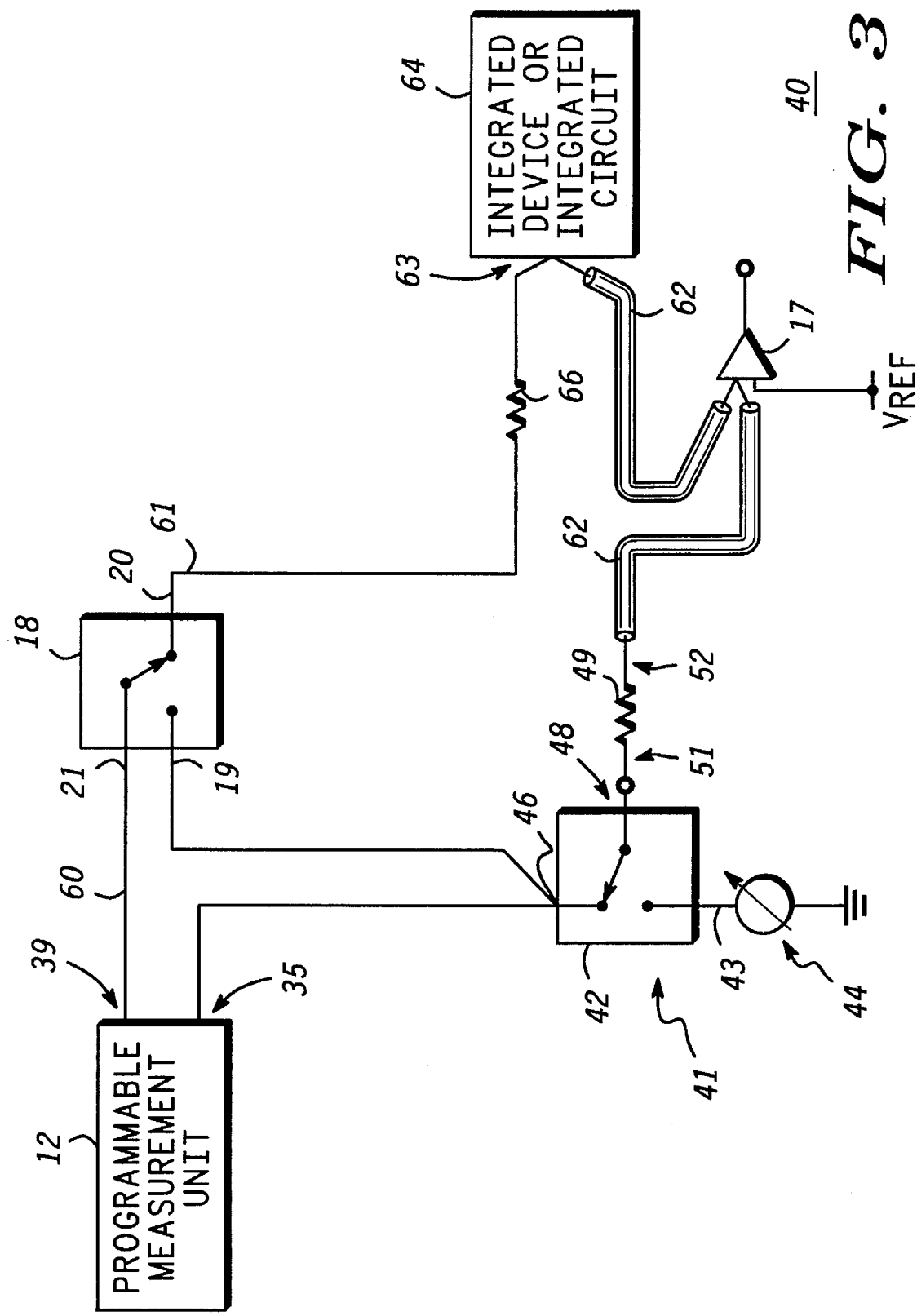
FIG. 3 illustrates a schematic diagram of an integrated device test system in accordance with a second embodiment of the present invention.

FIG. 3 illustrates a schematic diagram of a test system 40 in accordance with another embodiment of the present invention. The test system 40 comprises a drive circuit 41, a programmable measurement unit 12, and an analog multiplexer 18. The drive circuit 41 (also referred to as an AC driver) is a voltage mode drive circuit which provides two AC drive levels at a switch terminal 48. The AC drive levels provided at the switch terminal 48 are analogous to those delivered at the switch terminal 28 of FIG. 2 described supra.

The voltage mode drive circuit 41 comprises a switch 42 and a programmable voltage source 44. The switch 42 has a terminal 43, a terminal 46, and the terminal 48. The terminal 43 is connected to one terminal of the programmable voltage source 44. Since the programmable voltage source 44 provides a reference voltage level, it is also referred to as a reference voltage level. One terminal of the programmable voltage source 44 is coupled to a terminal 43 of the switch 42. The terminal 46 of the switch 42 is connected to a terminal 35 of the PMU 12.

Figure 4:
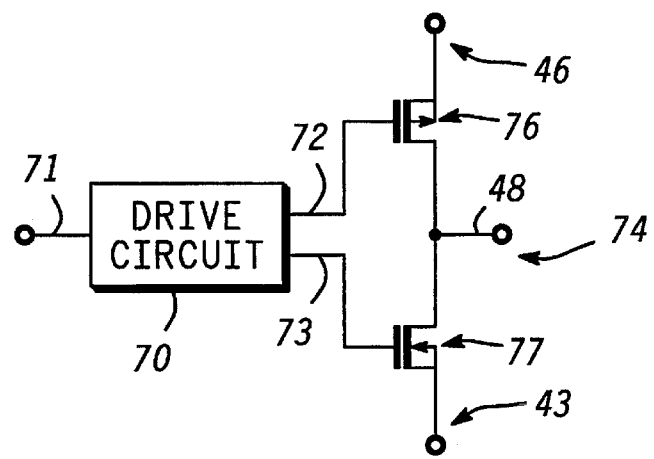
FIG. 4 illustrates a schematic diagram of a switch used in the integrated device test system of FIG. 3.

One embodiment of the voltage mode drive circuit 41 is illustrated in FIG. 4. The voltage mode drive circuit 41 comprises a drive circuit 70 having an input terminal 71 and two output terminals 72 and 73. The input terminal is connected to a logic input signal from a tester (not shown). The two output terminals 72 and 73 are connected to a CMOS switch 74 which serves as the switch 42. Drive circuits having a logic input signal such as drive circuit 70 are well known to those skilled in the art.

The CMOS switch 74 comprises a PMOS device 76 and an NMOS device 77. The output terminal 72 of the drive circuit 70 is connected to a gate terminal of the PMOS device 76, and a output terminal 73 is connected to a gate terminal of the NMOS device 77. The source terminal of the PMOS device 76 serves as the terminal 46 of the switch 42 and the source terminal of the NMOS device 77 serves as the terminal 43 of the switch 42. The drain terminals of the PMOS and NMOS devices are electrically coupled together and serve as the terminal 48 of the switch 42.

Referring again to FIG. 3, the PMU 12 has a force terminal 35 and a sense terminal 39. The force terminal 35 is connected to the drive circuit 41 and the sense terminal 39 is connected to a switch 18. More particularly, the switch 18 is an analog multiplexer having a lead 19, a lead 21, and a lead 20. The lead 19 is connected to the terminal 46 of the drive circuit 41 and the lead 21 is connected to the sense terminal 35 via the sense line 60. The lead 20 is connected to one end of an isolation resistor 66 via a remote sense line 61. The other end of the isolation resistor 66 is connected to a pin or integrated device lead 63 of a device under test 64. Although only one pin 63 of the device under test 64 is shown as being connected to the integrated circuit test system 40, it shall be understood that all the pins 63 of the device under test 64 may be tested using the integrated circuit test system 10.

In addition, a voltage detector 17 is provided, wherein one input to the voltage detector is coupled to the terminal 48 of the switch 42 and to the pin 63 via a force line 62. Preferably the force line 62 is a transmission line having a characteristic impedance. It is preferable that the transmission line 62 be properly terminated at the terminal 48. Accordingly, a terminal 51 of a resistor 49 is connected to the terminal 48 and a terminal 52 is connected to one end of the transmission line 62. The resistor 49 serves as a series terminating resistor. Preferably, the value of the resistor 49 is selected to match the characteristic impedance of the transmission line 62. For example, when the resistor 49 has a resistance value of approximately 50 ohms, the characteristic impedance of the transmission line 62 is set to match that of the resistance value of the resistor 49, i.e., the characteristic impedance of the transmission line 62 is set to approximately 50 ohms. In another example, the resistor 49 is connected directly to the pin 63 rather than being connected directly to the switch 42. A input terminal of the voltage detector 17 is coupled to a reference voltage labelled $V_{REF}$ in FIG. 1. The reference voltage $V_{REF}$ is selected in accordance with the electrical signal travelling towards the integrated device 64.

In operation, the integrated device test system 40 is used to measure the AC and DC parameters of an integrated device 64. For DC measurements, the switch 42 is configured such that the terminal 46 is coupled to the terminal 48. Thus, the terminal 48 is connected to the force terminal 35. Further, the switch 18 is configured such that the sense terminal is electrically connected to the isolation resistor 66, and thus to the pin 63. In FIG. 3, switch 18 is shown as being configured for operation in the DC measurement mode of operation. The PMU 12 forces a known voltage at the terminal 48 which is transmitted through the voltage mode drive circuit 41, through the resistor 49, down the transmission line 62, past the voltage detector 17, and to the pin 63. In other words, a voltage is applied to the drive circuit 41 and transmitted to the integrated device 64. The PMU 12 is used to force a voltage on the device 64 while measuring a resulting current. The current generated in response to the forced voltage and flowing through the pin 63 is sensed by the sense terminal 39 of the PMU 12.

It shall be understood that the PMU 12 is not limited to forcing a known voltage. Alternatively, the PMU 12 delivers a known current, which is transmitted, i.e., flows, through the voltage mode drive circuit 41 and appears at the pin 63. The voltage generated at the pin 63 is sensed by the sense terminal 39 of the PMU 12.

For AC measurements, the switch 18 is configured such that the sense terminal 39 is electrically connected to the terminal 46. Similar to the DC operating mode, placing the switch 42 in the first configuration provides known voltage or current levels at the terminal 48 from the PMU 12. The known voltage or current levels travel through the resistor 49, down the transmission line 62, past the voltage detector 17, and to the pin 63. Placing the switch 42 in the second configuration removes the known reference voltage or current level supplied by the PMU 12 to the terminal 48 and places another known reference voltage or current level from the programmable voltage source 44 to the terminal 48, which travels down the transmission line 62, past the voltage detector 17, and to the pin 63. By way of example, the voltage from the PMU 12 is a logic high voltage level and the voltage from the programmable voltage source is a logic low voltage level. As in the case of the integrated device test system 10 of FIG. 1, the voltage detector 17 is used for making AC timing measurements of the device under test 64. Likewise, the isolation resistor 66 isolates the capacitance of the sense line 61 during AC measurements.

By now it should be appreciated that an apparatus and a method for performing AC and DC test measurements has been provided. In the apparatus, a current or voltage source drive circuit in conjunction with an analog switch are used in place of a relay which is conventionally used. The relay limits the bandwidth of conventional test systems by introducing a parasitic capacitance. Further, the relay limits the number of devices that can be tested per unit time because of the amount of time it takes the relay to change from one configuration to another. The drive circuits of the present invention introduce lower parasitic capacitance values to the test system than do relays. Further, they change configuration faster than do relays and thus allow testing of an increased number of devices per unit of time.

I claim:

1. A method of delivering an electrical signal to an integrated device, comprising the steps of:
    delivering an AC electrical signal to the integrated device, wherein the step of delivering an AC electrical signal comprises the steps of:
    applying a first voltage to a drive circuit; transmitting the first voltage to the integrated device;
    removing the first voltage;
    applying a second voltage to the drive circuit; and
    transmitting the second voltage to the integrated device; and
    delivering a DC electrical signal to the integrated device, wherein the step of delivering a DC electrical signal comprises the steps of:
    applying the DC electrical signal to the drive circuit;
    transmitting the DC electrical signal to the integrated device; and
    measuring a resulting DC electrical signal transmitted to the integrated device.

2. A method of delivering an electrical signal to an integrated device as claimed in claim 1, further including detecting the first and second voltages transmitted to the integrated device.

3. A method of delivering an electrical signal to an integrated device as claimed in claim 1, further including sensing the DC electrical signal transmitted to the integrated device.

4. A method of delivering an electrical signal to an integrated device as claimed in claim 1, wherein the DC electrical signal is a voltage signal and the resulting DC electrical signal is a current signal.

5. A method of delivering an electrical signal to an integrated device as claimed in claim 1, wherein the DC electrical signal is a current signal and the resulting DC electrical signal is a voltage signal.

6. A method for delivering an electrical signal to an integrated device for characterizing the integrated device, comprising the steps of:
    determining an AC electrical timing parameter of the integrated device by:
    applying a first voltage to a drive circuit;
    transmitting the first voltage to the integrated device;
    using a voltage detector in cooperation with the first voltage to measure the AC electrical timing parameter; and
    removing the first voltage; and determining an output DC electrical signal by:
    applying an input DC electrical signal to the drive circuit;
    transmitting the input DC electrical signal to the integrated device; and
    measuring the output DC electrical signal.

7. The method of claim 6, further including the steps of:
    applying a second voltage to the drive circuit;
    transmitting the second voltage to the integrated device;
    using the voltage detector in cooperation with the second voltage to measure the AC electrical timing parameter; and
    removing the second voltage from the drive circuit.

8. The method of claim 7, wherein the step of determining AC electrical timing parameters includes determining a rise time.

9. The method of claim 7, wherein the step of determining AC electrical timing parameters includes determining a fall time.

10. The method of claim 7, wherein the step of determining AC electrical timing parameters includes determining a propagation delay.

11. The method of claim 6, wherein the step of determining an output DC electrical signal includes applying a DC voltage signal as the input DC electrical signal and measuring a DC current signal as the output DC electrical signal.

12. The method of claim 6, wherein the step of determining an output DC electrical signal includes applying a DC current signal as the input DC electrical signal and measuring a DC voltage signal as the output DC electrical signal.

13. The method of claim 6, wherein the step of determining AC electrical timing parameters includes determing a rise time, a fall time, and a propagation delay.

* * * * *